(12) United States Patent
Furutani et al.

(10) Patent No.: US 9,536,801 B2
(45) Date of Patent: *Jan. 3, 2017

(54) ELECTRONIC COMPONENT HAVING ENCAPSULATED WIRING BOARD AND METHOD FOR MANUFACTURING THE SAME

(71) Applicant: IBIDEN CO., LTD., Ogaki-shi (JP)

(72) Inventors: Toshiki Furutani, Ogaki (JP); Daiki Komatsu, Ogaki (JP); Nobuya Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/719,376

(22) Filed: May 22, 2015

(65) Prior Publication Data

US 2015/0255359 A1 Sep. 10, 2015

Related U.S. Application Data

(63) Continuation of application No. 13/214,277, filed on Aug. 22, 2011, now Pat. No. 9,059,187.

(Continued)

(51) Int. Cl.
*H01L 23/31* (2006.01)
*H01L 21/48* (2006.01)
(Continued)

(52) U.S. Cl.
CPC ......... *H01L 23/3114* (2013.01); *H01L 21/486* (2013.01); *H01L 21/4853* (2013.01); *H01L 21/563* (2013.01); *H01L 21/568* (2013.01);

*H01L 21/76804* (2013.01); *H01L 21/78* (2013.01); *H01L 23/28* (2013.01);
(Continued)

(58) Field of Classification Search
CPC ...... H01L 23/3114; H01L 23/28; H01L 23/29; H01L 23/3128; H01L 21/56
See application file for complete search history.

(56) References Cited

U.S. PATENT DOCUMENTS 5,255,157 A 10/1993 Hegel
6,245,598 B1 6/2001 Chen et al.
(Continued)

FOREIGN PATENT DOCUMENTS

JP 2006-294692 A 10/2006

*Primary Examiner* — Joseph C Nicely
(74) *Attorney, Agent, or Firm* — Oblon, McClelland, Maier & Neustadt, L.L.P.

(57) ABSTRACT

An electronic component including a wiring board having interlayer insulation layers and conductive patterns, the wiring board having a first surface and a second surface on the opposite side of the first surface, multiple first bumps formed on a first conductive pattern positioned on the first surface of the wiring board among the conductive patterns of the wiring board, a semiconductor element mounted on the first surface of the wiring board through the first bumps, an encapsulating resin encapsulating the semiconductor element and at least a portion of a side surface of the wiring board, the side surface of the wiring board extending between the first surface and second surface of the wiring board, and multiple of second bumps formed on the second surface of the wiring board and connected to a second conductive pattern of the conductive patterns in the wiring board.

20 Claims, 11 Drawing Sheets

Related U.S. Application Data (60) Provisional application No. 61/388,163, filed on Sep. 30, 2010.

(51) Int. Cl.
  *H01L 21/768* (2006.01)
  *H01L 23/522* (2006.01)
  *H01L 23/28* (2006.01)
  *H01L 23/29* (2006.01)
  *H01L 21/56* (2006.01)
  *H01L 23/498* (2006.01)
  *H01L 23/00* (2006.01)
  *H01L 21/78* (2006.01)

(52) U.S. Cl.
  CPC ............ *H01L 23/29* (2013.01); *H01L 23/293* (2013.01); *H01L 23/3128* (2013.01); *H01L 23/49816* (2013.01); *H01L 23/49822* (2013.01); *H01L 23/49827* (2013.01); *H01L 23/5226* (2013.01); *H01L 23/562* (2013.01); *H01L 24/97* (2013.01); *H01L 2224/16225* (2013.01); *H01L 2224/32225* (2013.01); *H01L 2224/73204* (2013.01); *H01L 2224/81005* (2013.01); *H01L 2224/83005* (2013.01); *H01L 2224/97* (2013.01); *H01L 2924/12042* (2013.01); *H01L 2924/15311* (2013.01); *H01L 2924/181* (2013.01); *H01L 2924/18161* (2013.01)

(56) References Cited

U.S. PATENT DOCUMENTS

| | | |
|---|---|---|
| 6,288,451 B1 | 9/2001 | Tsao |
| 6,555,414 B1 | 4/2003 | Vanfleteren et al. |
| 6,819,565 B2 | 11/2004 | Kao et al. |
| 6,960,493 B2 | 11/2005 | Ararao et al. |
| 6,979,890 B2 * | 12/2005 | Kambe ............ H01L 23/49822 257/678 |
| 7,230,818 B2 * | 6/2007 | Noguchi ................ H05K 1/162 361/528 |
| 7,271,479 B2 | 9/2007 | Zhao et al. |
| 7,400,035 B2 * | 7/2008 | Abe .................... H01L 21/4857 257/528 |
| 7,429,786 B2 | 9/2008 | Karnezos et al. |
| 7,624,501 B2 * | 12/2009 | Machida ................ H05K 3/462 174/262 |
| 7,901,986 B2 | 3/2011 | Arai et al. |
| 7,993,983 B1 | 8/2011 | Lin |
| 8,072,059 B2 | 12/2011 | Shim et al. |
| 8,143,097 B2 | 3/2012 | Chi et al. |
| 8,143,531 B2 * | 3/2012 | Miki ................... H01L 21/6835 174/255 |
| 2003/0030139 A1 * | 2/2003 | Karnezos ............ H01L 23/3128 257/712 |
| 2004/0087740 A1 * | 5/2004 | Ogura .................. C08G 59/066 525/523 |
| 2004/0106229 A1 | 6/2004 | Jiang et al. |
| 2006/0014873 A1 * | 1/2006 | Ikezawa .................... C08K 3/22 524/413 |
| 2006/0046352 A1 | 3/2006 | Low et al. |
| 2006/0180341 A1 * | 8/2006 | Kariya ................ H01L 21/4857 174/255 |
| 2006/0228562 A1 * | 10/2006 | Ukawa ................. C08G 59/027 428/413 |
| 2006/0283547 A1 * | 12/2006 | Yuri .................... H01L 21/4857 156/308.6 |
| 2007/0023887 A1 | 2/2007 | Matsui |
| 2007/0064375 A1 * | 3/2007 | Urashima ................ H01G 2/06 361/311 |
| 2008/0012148 A1 | 1/2008 | Takahashi |
| 2008/0029894 A1 * | 2/2008 | Wang ................ H01L 23/49822 257/762 |
| 2008/0036096 A1 | 2/2008 | Karnezos |
| 2008/0155820 A1 * | 7/2008 | Arai ...................... H01L 21/565 29/830 |
| 2008/0210460 A1 * | 9/2008 | Lien ....................... H05K 1/162 174/260 |
| 2008/0213942 A1 | 9/2008 | Hung et al. |
| 2009/0051048 A1 | 2/2009 | Lai et al. |
| 2009/0102063 A1 | 4/2009 | Lee et al. |
| 2009/0146318 A1 | 6/2009 | Horiuchi et al. |
| 2009/0230543 A1 | 9/2009 | Yu et al. |
| 2010/0006995 A1 * | 1/2010 | Kasuya ............ H01L 23/49503 257/676 |
| 2010/0237483 A1 | 9/2010 | Chi et al. |
| 2010/0240175 A1 | 9/2010 | Hong |
| 2011/0006404 A1 | 1/2011 | Lee et al. |
| 2011/0068444 A1 | 3/2011 | Chi et al. |
| 2011/0178623 A1 * | 7/2011 | Wu .......................... H01L 24/06 700/104 |
| 2012/0018906 A1 * | 1/2012 | Mino .................... H01L 21/561 257/789 |
| 2013/0026662 A1 * | 1/2013 | Iwashige ................ C08L 61/06 257/788 |
| 2015/0026975 A1 | 1/2015 | Kariya et al. |

* cited by examiner

ELECTRONIC COMPONENT HAVING ENCAPSULATED WIRING BOARD AND METHOD FOR MANUFACTURING THE SAME

CROSS-REFERENCE TO RELATED APPLICATIONS

The present application is a continuation of and claims the benefit of priority to U.S. application Ser. No. 13/214,277, filed Aug. 22, 2011, which claims the benefit of priority to U.S. Application No. 61/388,163, filed Sep. 30, 2010. The entire contents of these applications are incorporated herein by reference.

BACKGROUND OF THE INVENTION

Field of the Invention

The present invention relates to an electronic component formed by mounting a semiconductor element on a wiring board and to its manufacturing method.

Discussion of the Background

In Japanese Laid-Open Patent Publication No. 2006-294692, an electronic component which has a wiring board, a semiconductor element mounted on a main surface of the wiring board and encapsulating resin to encapsulate the semiconductor element is described. Here, the wiring board is a wiring board without a core substrate, a so-called coreless wiring board. The encapsulating resin coats only a main surface of the wiring board.

Such an electronic component is manufactured as follows. First, a laminated section is formed on a support material by alternately laminating resin insulation layers and conductive patterns. Next, a semiconductor element is mounted through bumps on the conductive pattern positioned on the outermost layer of the laminated section. Then, encapsulating resin is formed to encapsulate the semiconductor element, and then the support material is removed. Then, a buildup section is formed on the main surface exposed by removing the support material.

The contents of Japanese Laid-Open Patent Publication No. 2006-294692 are incorporated herein by reference in their entirety in this application.

SUMMARY OF THE INVENTION

According to one aspect of the present invention, an electronic component includes a wiring board having multiple interlayer insulation layers and multiple conductive patterns, the wiring board having a first surface and a second surface on the opposite side of the first surface, multiple first bumps formed on a first conductive pattern positioned on the first surface of the wiring board among the conductive patterns of the wiring board, a semiconductor element mounted on the first surface of the wiring board through the first bumps, an encapsulating resin encapsulating the semiconductor element and at least a portion of a side surface of the wiring board, the side surface of the wiring board extending between the first surface and second surface of the wiring board, and multiple second bumps formed on the second surface of the wiring board and connected to a second conductive pattern of the conductive patterns in the wiring board.

According to another aspect of the present invention, a method for manufacturing an electronic component includes preparing a support material, forming a laminated structure having multiple interlayer insulation layers, multiple conductive patterns and multiple bumps, forming a groove in the laminated body such that a portion of the laminated body is surrounded by the groove, mounting on the portion of the laminated body a semiconductor element through the bumps on a conductive pattern formed on a surface of the laminated body, filling an encapsulating resin in the groove and over the portion of the laminated body such that the semiconductor element and at least a portion of the laminated body is encapsulated by the encapsulating resin, removing the support material from the laminated body, and cutting through the encapsulating resin along the groove after curing the encapsulating resin such that the portion of the laminated body is cut out and the encapsulating resin encapsulates at least a portion of a side surface of the laminated body.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

In the drawings, arrows (Z1, Z2) each indicate a lamination direction corresponding to a direction along a normal line (or a thickness direction) to the main surfaces (upper and lower surfaces) of each layer. On the other hand, arrows (X1, X2) and (Y1, Y2) each indicate a direction perpendicular to a lamination direction (directions parallel to the main surfaces of each layer). The main surfaces of each layer are on the X-Y plane. Side surfaces of each layer are on the X-Z plane or the Y-Z plane.

Two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface.

Regarding via conductors or their holes (via holes), a cross section perpendicular to directions Z (X-Y plane) is referred to as a horizontal cross section. Also, a cross section parallel to directions Z (X-Z plane or Y-Z plane) is referred to as a vertical cross section.

Conductive patterns may include wiring that forms conductive circuits (including ground), pads, lands, via conductors and so forth, or may be plain patterns that do not form conductive circuits. In addition, in a wiring board with a built-in electronic component or wiring board, conductive patterns include electrodes of the electronic components and pads of the other wiring board. "Fan out" means to enlarge terminal pitches of a device to enable electrical connection with another device having wider terminal pitches.

Opening portions include notches, slits and so forth in addition to holes and grooves. Holes are not limited to penetrating holes, and non-penetrating holes are also included. Holes include via holes and through holes. Conductor formed in a via hole is referred to as a via conductor, and conductor formed in a through hole is referred to as a through-hole conductor.

Among the conductors formed in opening portions (such as via conductors and through-hole conductors), conductive film formed on inner surfaces (side and bottom surfaces) of an opening portion is referred to as a conformal conductor, and conductor filled in an opening portion is referred to as a filled conductor.

Plating indicates depositing a layer of conductor (such as metal) on surfaces of metal, resin or the like as well as the deposited conductive layer (such as a metal layer). Plating includes wet plating such as electrolytic plating as well as dry plating such as PVD (physical vapor deposition) and CVD (chemical vapor deposition).

Figure 1:
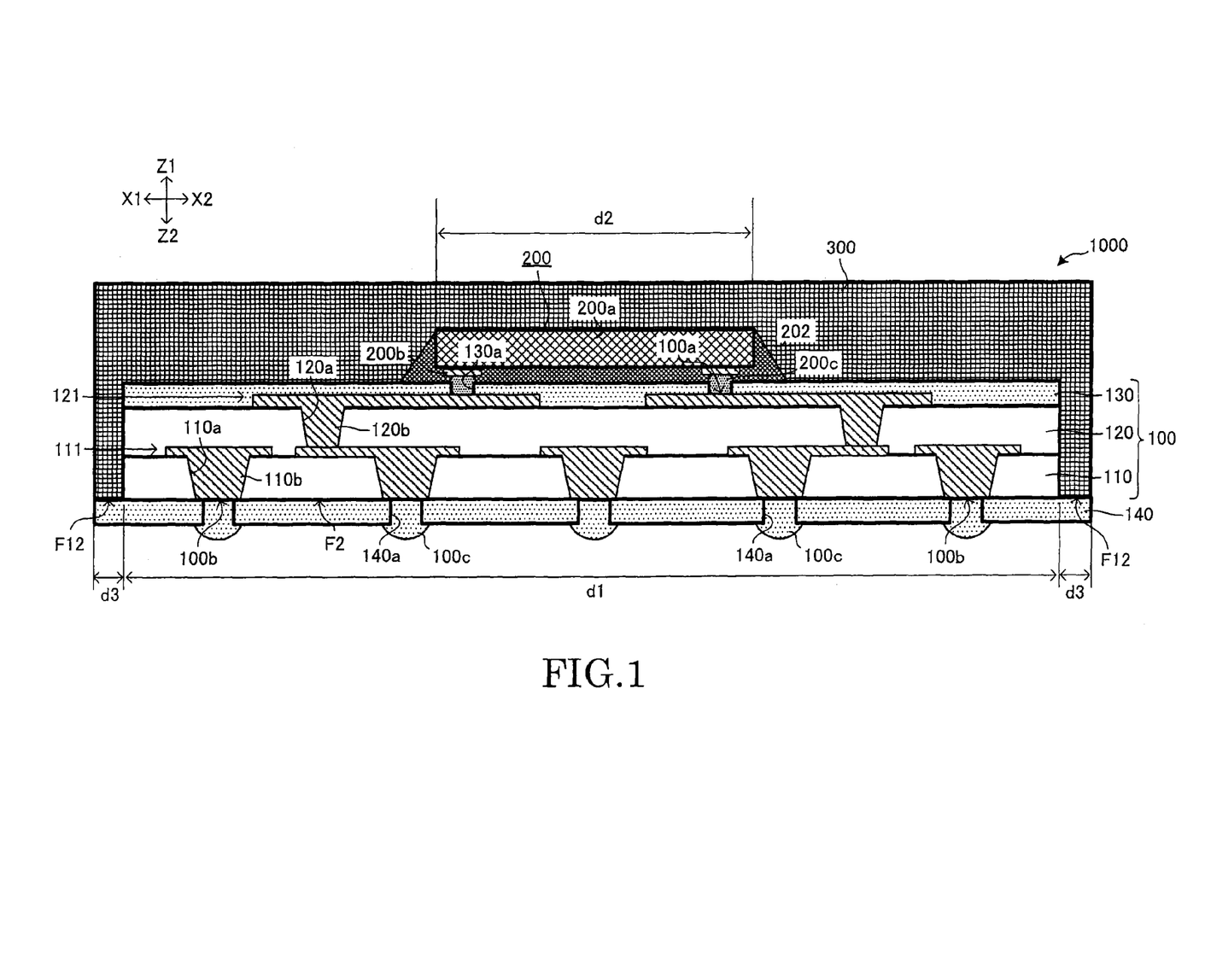
FIG. 1 is a cross-sectional view showing an electronic component according to an embodiment of the present invention.
Figure 2:
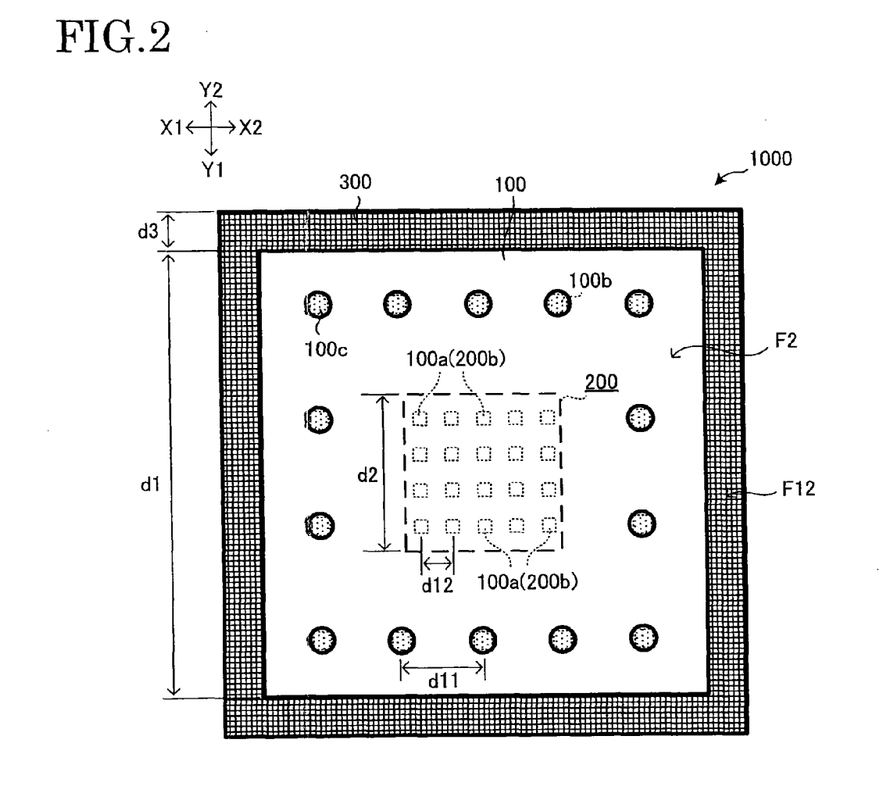
FIG. 2 is a plan view showing an electronic component according to an embodiment of the present invention.

As shown in FIGS. 1 and 2, electronic component 1000 of the present embodiment has wiring board 100, semiconductor chip 200 (semiconductor element) and encapsulating resin 300. Pads (100a) are exposed on the first main surface of wiring board 100, and pads (100b) are exposed on the second main surface of wiring board 100. Bumps (200c) (first bumps) are formed on pads (100a), and bumps (100c) (second bumps) are formed on pads (100b).

In the present embodiment, as shown in FIG. 2, pitch (d11) of pads (100b) (pitch of second bumps) is set greater than pitch (d12) of pads (100a) (pitch of first bumps) (d12<d11). Namely, in electronic component 1000 of the present embodiment, by repositioning terminals through wiring board 100, terminal pitches fan out from semiconductor chip 200 toward bump (100c). Accordingly, semiconductor chip 200 having a fine terminal pitch can be electrically connected to a motherboard or the like having a wider terminal pitch. Pitch (d11) is 110~150 μm, for example, and pitch (d12) is 30~60 μm, for example.

Wiring board 100 is a coreless wiring board. Namely, wiring board 100 does not have a core substrate. In particular, wiring board 100 has insulation layers (110, 120), solder resists (130, 140), conductive patterns (111, 121) and via conductors (110b, 120b). Semiconductor chip 200 is mounted on the first main surface of wiring board 100. Then, encapsulating resin 300 encapsulates semiconductor chip 200.

Conductive pattern 111 is formed on insulation layer 110. Holes (110a) (via holes) are formed in insulation layer 110, and via conductors (110b) (second conductive pattern) made of plating are formed in holes (110a). Via conductors (110b) penetrate through insulation layer 110 (interlayer insulation layer). Of the surfaces of insulation layer 110, solder resist 140 is formed on a surface opposite the surface where conductive pattern 111 is formed. Solder resist 140 has opening portions (140a) which expose the bottom portions of via conductors (110b).

Bumps (100c) are formed on the bottom portions of via conductors (110b) with surface treatment film in between (not shown in the drawings). Such surface treatment film is made of Ni and Au, for example.

Insulation layer 120 is formed on insulation layer 110 and on conductive pattern 111. Also, conductive pattern 121 (first conductive pattern) is formed on insulation layer 120. In addition, holes (120a) (via holes) are formed in insulation layer 120. Then, by filling conductor in holes (120a) (such as copper plating), the conductor in holes (120a) becomes via conductors (120b) (filled conductors). Conductive pattern 111 and conductive pattern 121 are electrically connected to each other by via conductors (120b).

The shape of via conductors (110b, 120b) is, for example, a tapered column (truncated cone) with a diameter decreasing from the first-surface side toward the second-surface side. Namely, the horizontal cross section (on the X-Y plane) of via conductors (110b, 120b) is shaped to be a complete circle, for example, and the vertical cross section is shaped to be a trapezoid, for example. However, the shape of via conductors (110b, 120b) is not limited specifically, and it may also be a column, for example.

Insulation layers (110, 120) and solder resists (130, 140) are made of photosensitive resin, for example. However, the material for insulation layers (110, 120) and solder resists (130, 140) is not limited specifically, and any material other than photosensitive resin may also be used.

Figure 3:
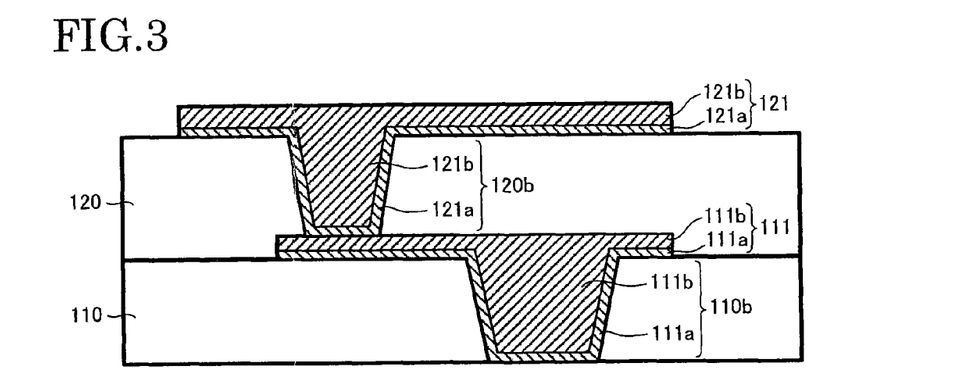
FIG. 3 is a cross-sectional view showing the structure of a conductive pattern and a via conductor according to an embodiment of the present invention.

As shown in FIG. 3, for example, conductive pattern 111 and via conductors (110b) are each made of first conductive film (111a) formed on insulation layer 110 and second conductive film (111b) formed on first conductive film (111a). Also, as shown in FIG. 3, for example, conductive pattern 121 and via conductors (120b) are each made of first conductive film (121a) formed on insulation layer 120 and second conductive film (121b) formed on first conductive film (121a). Here, first conductive films (111a, 121a) are preferred to be, for example, triple-layered with TiN (lower layer), Ti (middle layer) and Cu (upper layer), since such a structure makes it easy to maintain both prevention of ion migration and adhesiveness with insulation layers. Those three layers are formed by sputtering, for example. Second conductive films (111b, 121b) are preferred to be formed with Cu, for example, from the viewpoint of electrical resistance. In the present embodiment, second conductive films (111b, 121b) are formed with electroless copper-plated film and electrolytic copper-plated film formed thereon.

As shown in FIG. 1, on insulation layer 120, solder resist 130 is formed having opening portions (130a) to expose portions of conductive pattern 121. Bumps (200c) are formed on pads (100b) exposed through opening portions (130a) in solder resist 130.

Semiconductor chip 200 has chip body (200a) and multiple electrode pads (200b). Electrode pads (200b) are arranged at predetermined spots on chip body (200a) (for example, see FIG. 2). Underfill material 202 is filled between wiring board 100 and semiconductor chip 200 so that mismatching of thermal expansion coefficients is mitigated. Semiconductor chip 200 is an IC chip where elements such as a resistor, a diode, a transistor, a capacitor or the like are integrated. Chip body (200a) is made of silicon, for example.

Semiconductor chip 200 is encapsulated with encapsulating resin 300 (molding resin). Encapsulating resin 300 contains a flexible epoxy resin and a bisphenol-type epoxy resin, for example. In addition, encapsulating resin 300 has surface (F12) positioned on the same level with second surface (F2) of wiring board 100. Accordingly, the entire portion (entire surface) of the side surfaces of wiring board 100 is coated with encapsulating resin 300. However, the present embodiment is not limited to such; for example, only a portion of the side surfaces of wiring board 100 may be coated with encapsulating resin 300 (see later-described FIG. 17). Also, in the present embodiment, encapsulating resin 300 coats the entire portion of all side surfaces (four side surfaces) of wiring board 100 along with the first main surface of wiring board 100 as shown in FIGS. 1 and 2. However, it is not always required that all the side surfaces of wiring board 100 be coated with encapsulating resin 300 (see later-described FIG. 18).

In the present embodiment, encapsulating resin 300 has a lower thermal expansion coefficient than that of each interlayer insulation layer (insulation layers 110, 120) of wiring board 100. Thus, thermal expansion coefficient (C2) of encapsulating resin 300 is lower than thermal expansion coefficient (C3) of wiring board 100. Also, thermal expansion coefficient (C1) of semiconductor chip 200 is lower than thermal expansion coefficient (C2) of encapsulating resin 300. Namely, thermal expansion coefficient (C1) is the lowest, and thermal expansion coefficient (C2) is second lowest and thermal expansion coefficient (C3) is the highest (C1<C2<C3). Accordingly, a thermal expansion coefficient mismatch is resolved between semiconductor chip 200 and wiring board 100, reducing the stress that would cause warping (which will be described in detail later). If at least thermal expansion coefficient (C2) is lower than thermal expansion coefficient (C3), substantially the same effects are achieved.

In the present embodiment, a planar shape of wiring board 100 (on the X-Y plane) is square, for example, and its side length (d1) is 4~15 mm, for example. Also, a planar shape of semiconductor chip 200 (on the X-Y plane) is square, for example, and its side length (d2) is 2~10 mm, for example. In addition, thickness (d3) of the portion where encapsulating resin 300 coats a side surface of wiring board 100 is preferred to be 0.1~0.5 mm.

In electronic component 1000 of the present embodiment, encapsulating resin 300 coats the side surfaces of wiring board 100 where warping is especially great. Thus, the amount of resin (encapsulating resin 300) to encapsulate semiconductor chip 200 increases, and the relative amount of resin to form interlayer resin insulation layers is considered to decrease. Accordingly, wiring board 100 is suppressed from warping caused by heat cycles. Especially, such an effect is considered to be greater since encapsulating resin 300 coats the entire portion of all the side surfaces of wiring board 100 (see FIG. 2). In addition, since thermal expansion coefficients (C1, C2, C3) of semiconductor chip 200, encapsulating resin 300 and wiring board 100 respectively have the above relationship, if the amount of encapsulating resin 300 having mid-level thermal expansion coefficient (C2) increases, the thermal expansion coefficient mismatch between semiconductor chip 200 and wiring board 100 is resolved, reducing stress that would cause warping. Such a structure is especially effective if a coreless wiring board, which tends to warp, is required to be used as wiring board 100. Furthermore, by suppressing warping in wiring board 100, when electronic component 1000 is mounted on another wiring board (such as a motherboard) through bumps (100c) (secondary mounting), for example, connection failure is remarkably reduced at the mounting area. In addition, bumps (100c) are suppressed from cracking and connection reliability in the above mounting area is enhanced. Therefore, electronic component 1000 has high reliability against heat cycles. Especially, since the above connection failure tends to occur if the pitch of bumps (100c) is narrow, the above structure of electronic component 1000 is effective when the pitch of bumps (100c) is required to be narrow.

Next, a method is described for manufacturing the above electronic component 1000. In the present embodiment, electronic component 1000 is manufactured by the method shown in FIG. 4.

Figure 5:
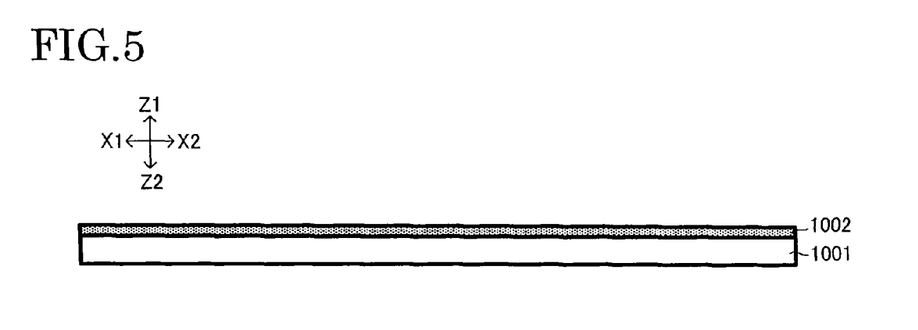
FIG. 5 is a view to illustrate a step for preparing a support material.

In step (S11), support sheet 1001 (support material) is prepared as shown in FIG. 5. Support sheet 1001 is made of glass, for example. Then, adhesive layer 1002 is formed on support sheet 1001.

Figure 4:
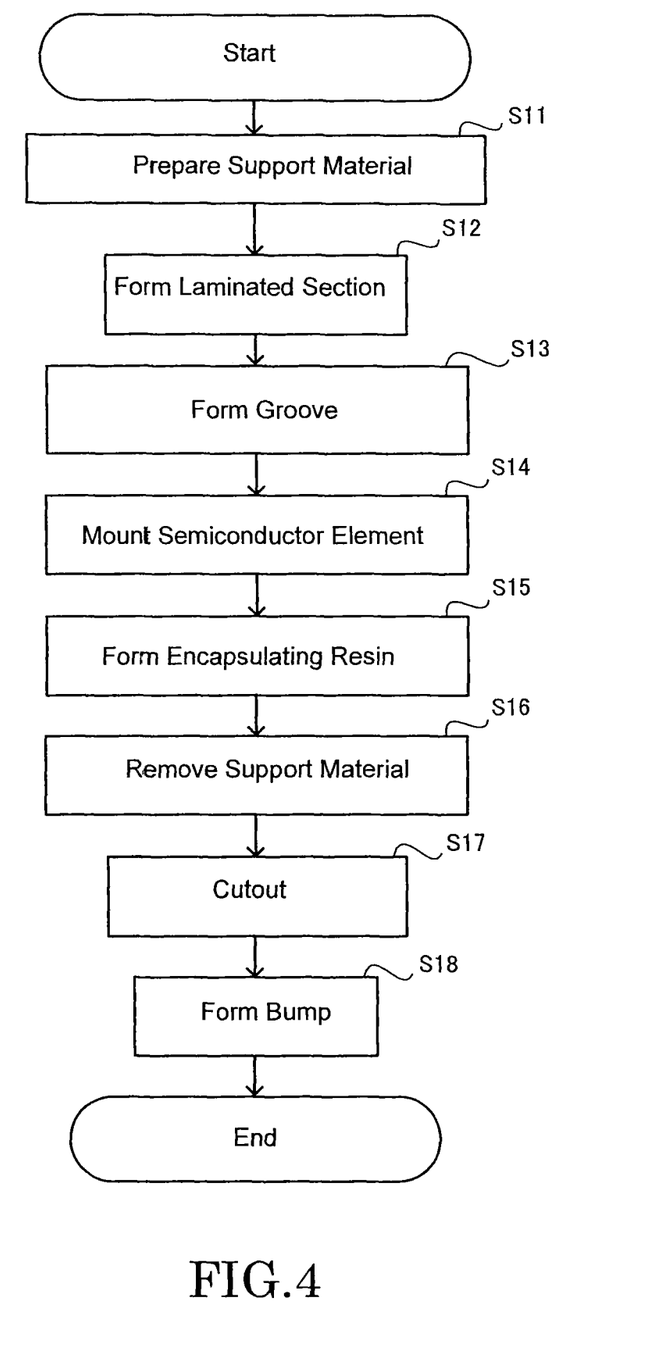
FIG. 4 is a flowchart showing a method for manufacturing an electronic component according to an embodiment of the present invention.

In step (S12) of FIG. 4, a laminated section is formed on support sheet 1001 with adhesive layer 1002 in between. That laminated section is formed by alternately laminating a resin insulation layer and a conductive pattern.

Figure 6:
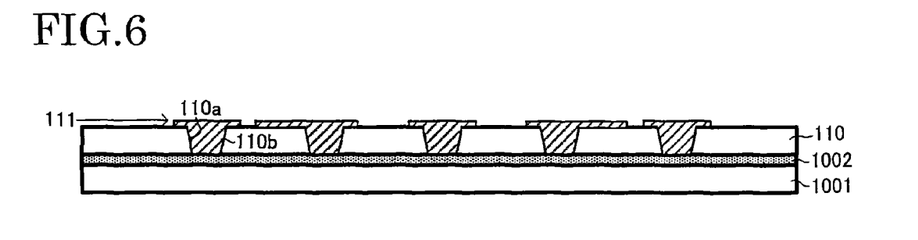
FIG. 6 is a view to illustrate a first step for forming a laminated section.

Specifically, as shown in FIG. 6, insulation layer 110 (resin insulation layer) made of resin, for example, is positioned on adhesive layer 1002. Insulation layer 110 and adhesive layer 1002 are adhered through a thermal treatment, for example.

Next, holes (110a) (via holes) are formed in insulation layer 110 using a laser, for example. Holes (110a) reach adhesive layer 1002. Then, desmearing and soft etching are performed if required.

Next, using a full-additive method, a semi-additive (SAP) method, a subtractive method or the like, for example, via conductors (110b) (filled conductors) are formed in holes (110a) while conductive pattern 111 is formed on insulation layer 110. Conductive pattern 111 and via conductors (110b) are each made of first conductive film (111a) and second conductive film (111b) (see FIG. 3). More specifically, first conductive film (111a) is triple-layered with a TiN layer (lower layer), a Ti layer (middle layer) and a Cu layer (upper layer). Also, second conductive film (111b) is formed with an electroless copper-plated film on the Cu layer and an electrolytic plated film on the electroless copper-plated film.

Figure 7:
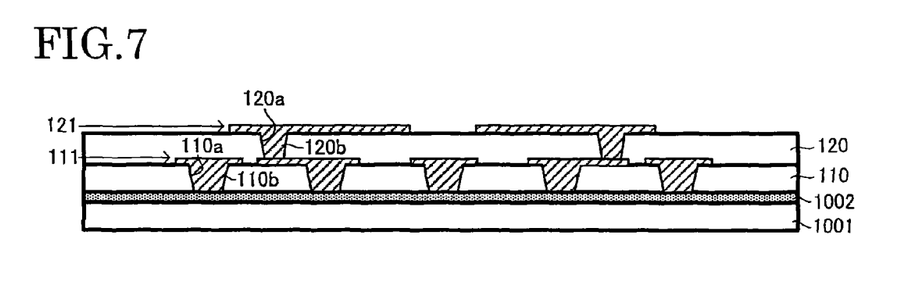
FIG. 7 is a view to illustrate a second step subsequent to the step in FIG. 6.

Next, as shown in FIG. 7, insulation layer 120 is formed on insulation layer 110 by lamination, for example. Insulation layer 120 is formed to coat conductive pattern 111.

Next, holes (120a) (via holes) are formed in insulation layer 120 by a laser, for example. Holes (120a) reach conductive pattern 111 and expose its portions. After that, desmearing and soft etching are performed if required.

Next, using a full-additive method, a semi-additive (SAP) method, a subtractive method or the like, for example, via conductors (120b) (filled conductors) are formed in holes (120a) while conductive pattern 121 is formed on insulation layer 120. Conductive pattern 121 and via conductors (120b) are each double-layered with first conductive film (121a) and second conductive film (121b) (see FIG. 3). More specifically, first conductive film (121a) is triple-layered with a TiN layer (lower layer), a Ti layer (middle layer) and a Cu layer (upper layer). Also, second conductive film (121b) is formed with an electroless copper-plated film on the Cu layer and an electrolytic plated film on the electroless copper-plated film.

Figure 8A:
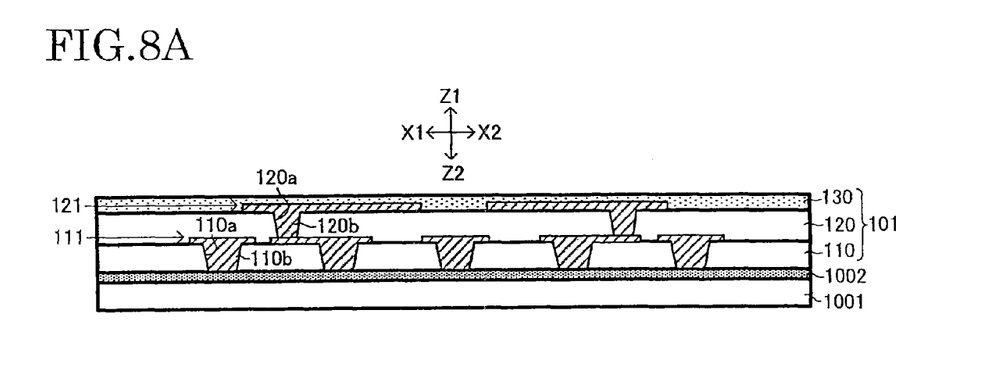
FIG. 8A is a cross-sectional view to illustrate a third step subsequent to the step in FIG. 7.
Figure 8B:
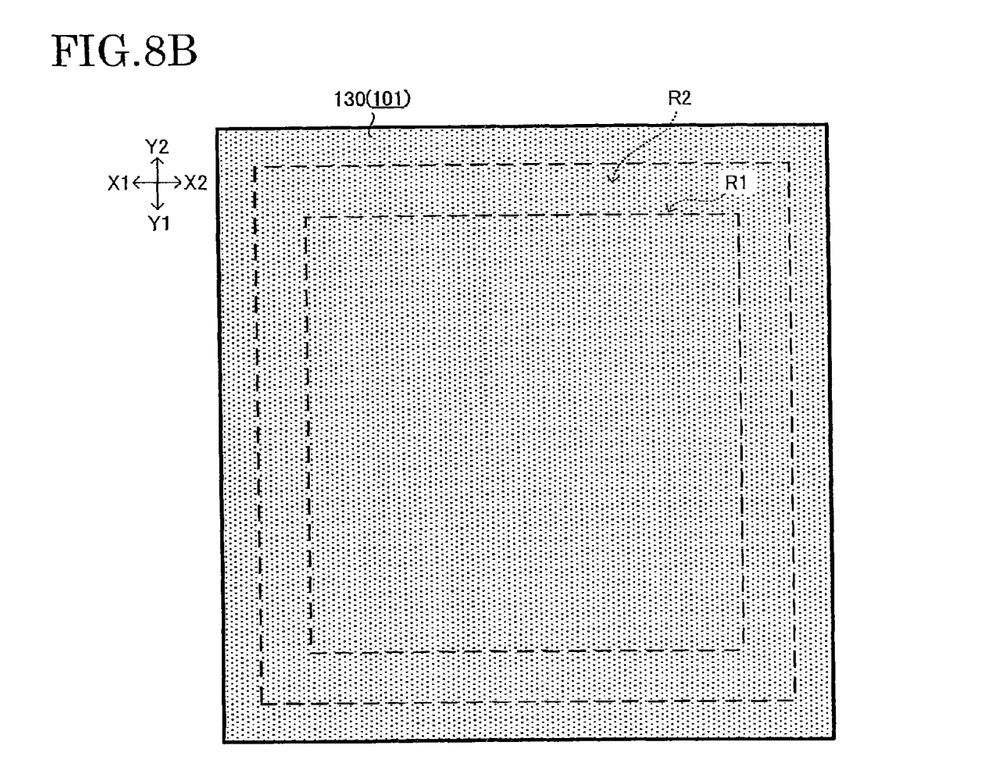
FIG. 8B is in addition to FIG. 8A, a plan view to illustrate a third step subsequent to the step in FIG. 7.

Next, as shown in FIGS. 8A and 8B, solder resist 130 is formed on insulation layer 120. In doing so, on support sheet 1001, laminated section 101 is formed with insulation layers (110, 120), conductive patterns (111, 121) and solder resist 130. Solder resist 130 is made of photosensitive resin, for example.

In step (S13) of FIG. 4, a groove is formed.

Figure 9A:
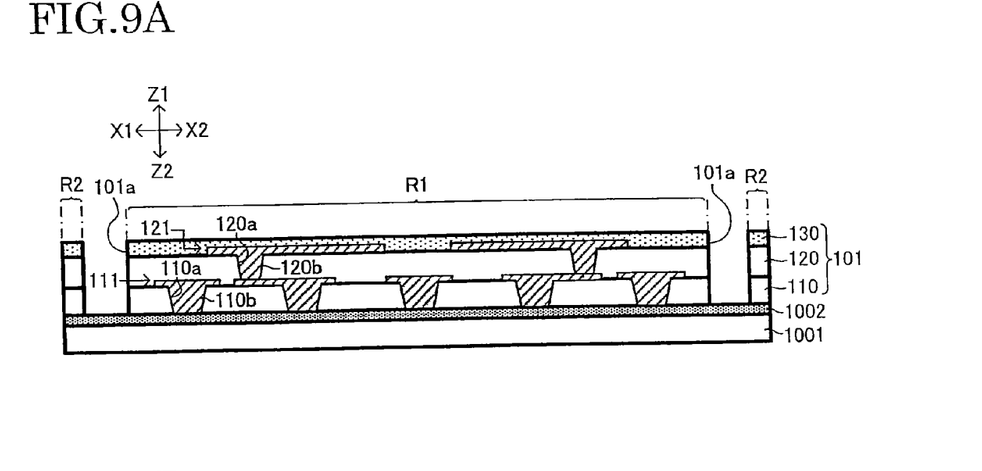
FIG. 9A is a cross-sectional view to illustrate a step for forming a groove.
Figure 9B:
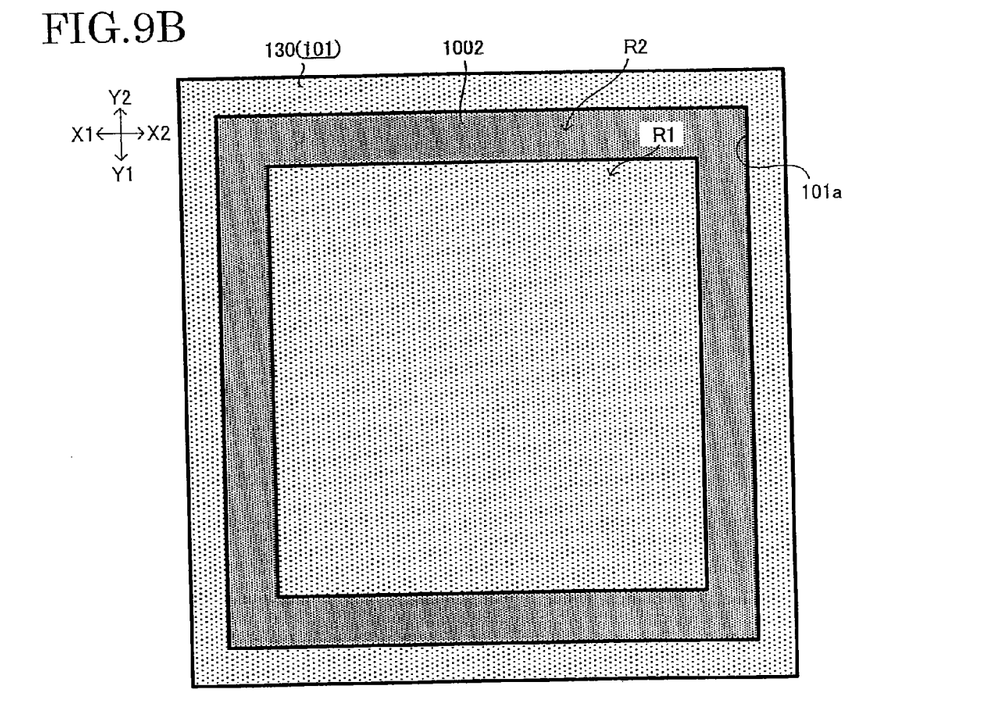
FIG. 9B is in addition to FIG. 9A, a plan view to illustrate a step for forming a groove.

Specifically, as shown in FIGS. 9A and 9B, groove (101a) is formed in region (R2) surrounding predetermined region (R1) of laminated section 101 previously shown in FIG. 8B. In particular, predetermined portions of insulation layers are removed through a predetermined laser process, for example. In doing so, groove (101a) is formed to surround predetermined region (R1) of laminated section 101. Region (R2) and groove (101a) are positioned along dicing lines, for example. The method for forming groove (101a) is not limited to the above. For example, if insulation layers that form laminated section 101 are each made of photosensitive resin, each time an insulation layer is formed, groove (101a) may be formed by exposure and development treatment to penetrate through the insulation layer.

In step (S14) of FIG. 4, semiconductor chip 200 (semiconductor element) is mounted.

Figure 10:
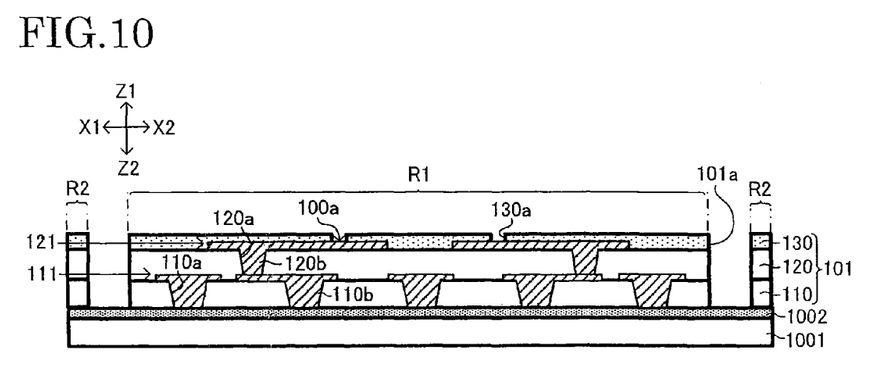
FIG. 10 is a view to illustrate a first step for mounting a semiconductor element.
Figure 11:
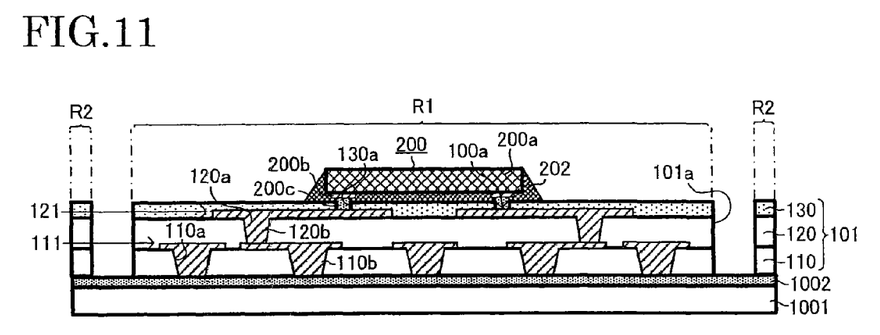
FIG. 11 is a view to illustrate a second step subsequent to the step in FIG. 10.

Specifically, opening portions (130a) are formed at predetermined spots in region (R1) of solder resist 130 as shown in FIG. 10. In doing so, portions of conductive pattern 121 (pads 100a) are exposed. Then, semiconductor chip 200 having bumps (200c) is prepared, and semiconductor chip 200 is flip-chip mounted on pads (100a) through bumps (200c) as shown in FIG. 11. Semiconductor chip 200 is an IC chip, for example, and bumps (100c) are solder bumps, for example.

Next, insulative underfill material 202 is injected between wiring board 100 and semiconductor chip 200. As a result, semiconductor chip 200 is mounted through bumps (200c) on the conductive pattern positioned on the outermost layer in region (R1) of laminated section 101 (conductive pattern 121).

In step (S15) of FIG. 4, encapsulating resin 300 is formed.

Figure 12:
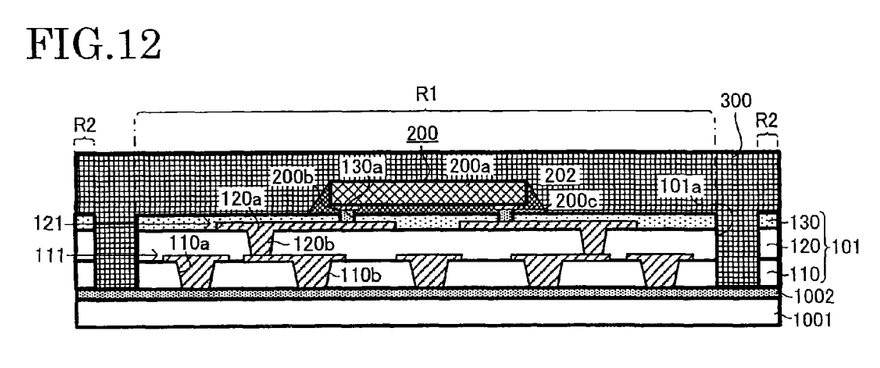
FIG. 12 is a view to illustrate a step for encapsulating the semiconductor element.

Specifically, as shown in FIG. 12, for example, encapsulating resin 300 to encapsulate semiconductor chip 200 is formed in groove (101a) and on region (R1) of laminated section 101. In doing so, semiconductor chip 200 is coated with underfill material 202 and encapsulating resin 300. Namely, semiconductor chip 200 is encapsulated.

In step (S16) of FIG. 4, support sheet 1001 (support material) is removed.

Figure 13:
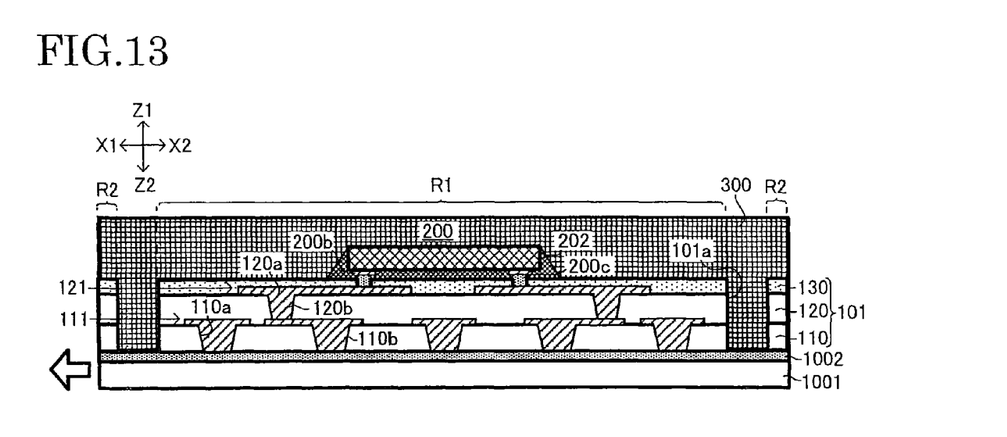
FIG. 13 is a view to illustrate a step for removing the support material.

Specifically, as shown in FIG. 13, for example, after adhesive layer 1002 is irradiated by laser to soften it, support sheet 1001 is slid in a direction X (or a direction Y) so that support sheet 1001 is removed from the second main surface of laminated section 101. Accordingly, via conductors (110b) (pads 100a) are exposed on the second main surface of laminated section 101 (see FIG. 14). After support sheet 1001 is removed from laminated section 101, if adhesive layer 1002 remains on the second main surface of laminated section 101, adhesive layer 1002 is removed through cleaning. In addition, support sheet 1001 may be used again after being cleaned, for example.

Figure 14:
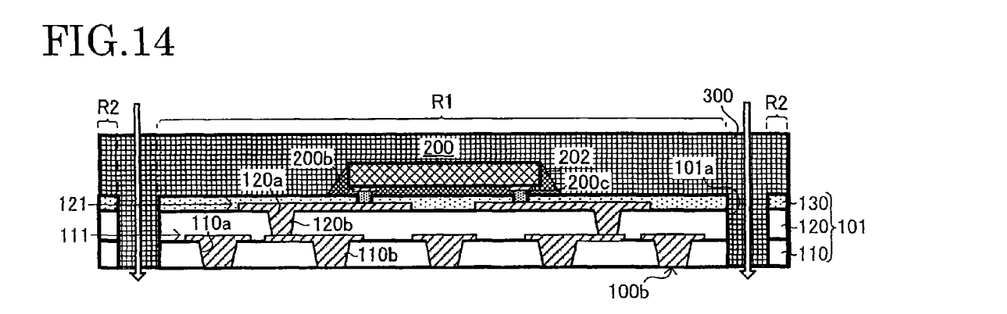
FIG. 14 is a view to illustrate a cut-out step.
Figure 15:
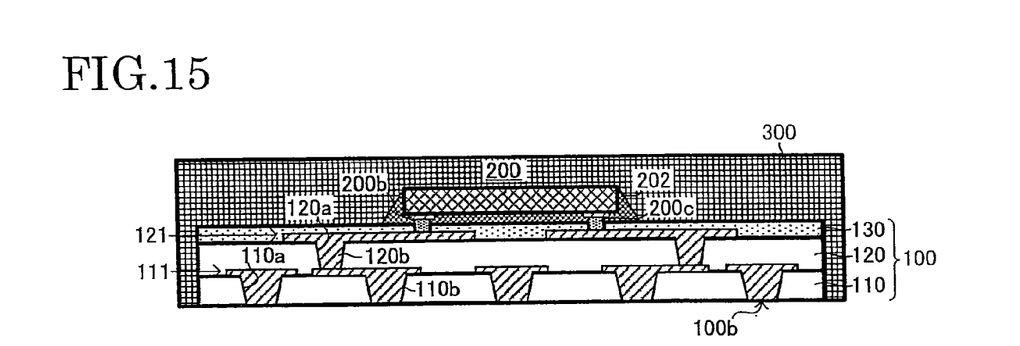
FIG. 15 is a view showing a wiring board cut out by the step in FIG. 14.

In step (S17) of FIG. 4, as shown in FIG. 14, for example, by cutting along groove (101a) using a dicing saw, for example, region (R1) of laminated section 101, where semiconductor chip 200 is mounted, and encapsulating resin 300, which coats the entire portion of all the side surfaces (four side surfaces) of region (R1), are cut out. Accordingly, as shown in FIG. 15, for example, wiring board 100 is cut out.

Figure 16:
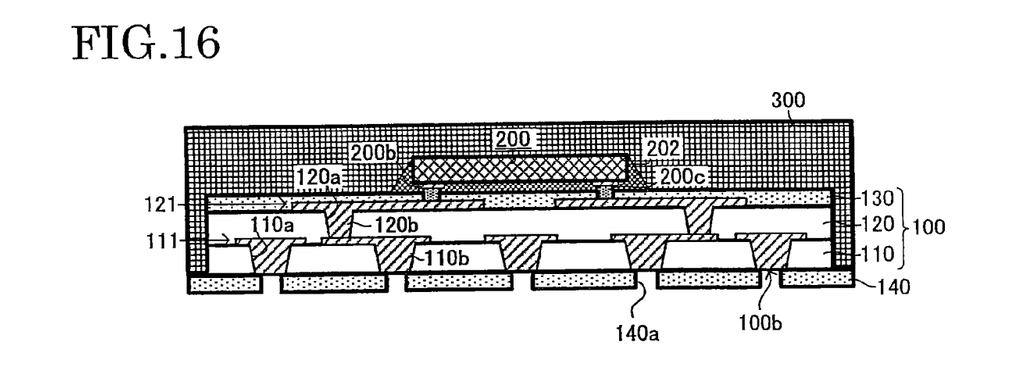
FIG. 16 is a view to illustrate a step for forming solder resist.

In step (S18) of FIG. 4, solder resist 140 having opening portions (140a) is formed on the second main surface of wiring board 100 as shown in FIG. 16. Then, bumps (100c) are formed on pads (100b) exposed through opening portions (140a) (see FIG. 1). Accordingly, electronic component 1000 previously shown in FIG. 1 is completed.

The manufacturing method according to the present embodiment is suitable for manufacturing electronic component 1000. Using such a manufacturing method, an excellent electronic component 1000 with less chance of warping is obtained.

So far, an electronic component and its manufacturing method according to an embodiment of the present invention have been described. However, the present invention is not limited to the above embodiment.

Figure 17:
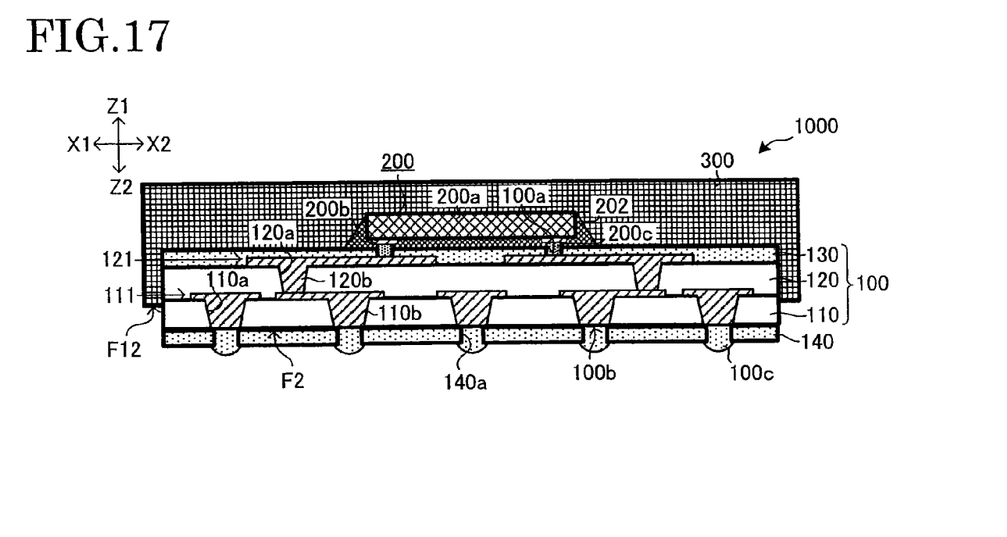
FIG. 17 is a view showing an example in which only portions of the side surfaces of a wiring board are coated with encapsulating resin.

It is not always required that the entire portion of side surfaces of wiring board 100 be coated with encapsulating resin 300. It is an option that only portions of the side surfaces of wiring board 100 are coated with encapsulating resin 300. In particular, as shown in FIG. 17, for example, an example may be as follows: along the side surfaces of wiring board 100, portions near the second main surface (surface-layer portions) of wiring board 100 are not coated with encapsulating resin 300.

Figure 18:
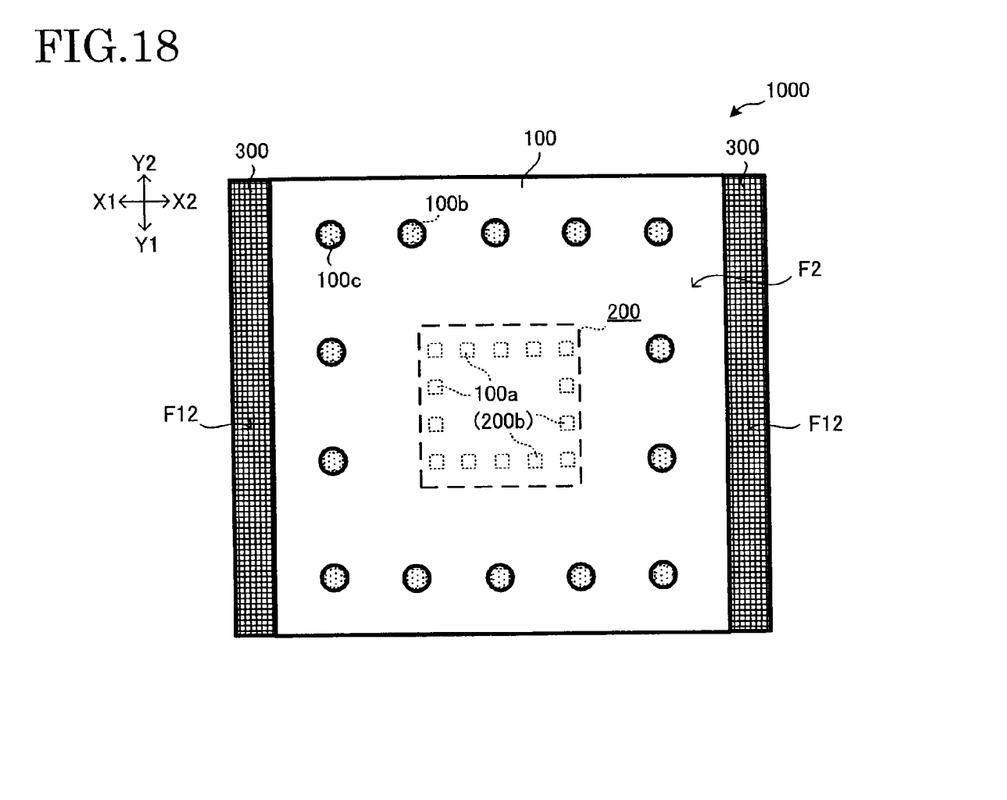
FIG. 18 is a view showing an example in which only two side surfaces of a wiring board are coated with encapsulating resin.

It is not always required that all the side surfaces of wiring board 100 be coated with encapsulating resin 300. For example, as shown in FIG. 18, it is an option that only two side surfaces of wiring board 100 facing opposite directions (side surfaces in the X1 and X2 directions) are coated with encapsulating resin 300.

Figure 19:
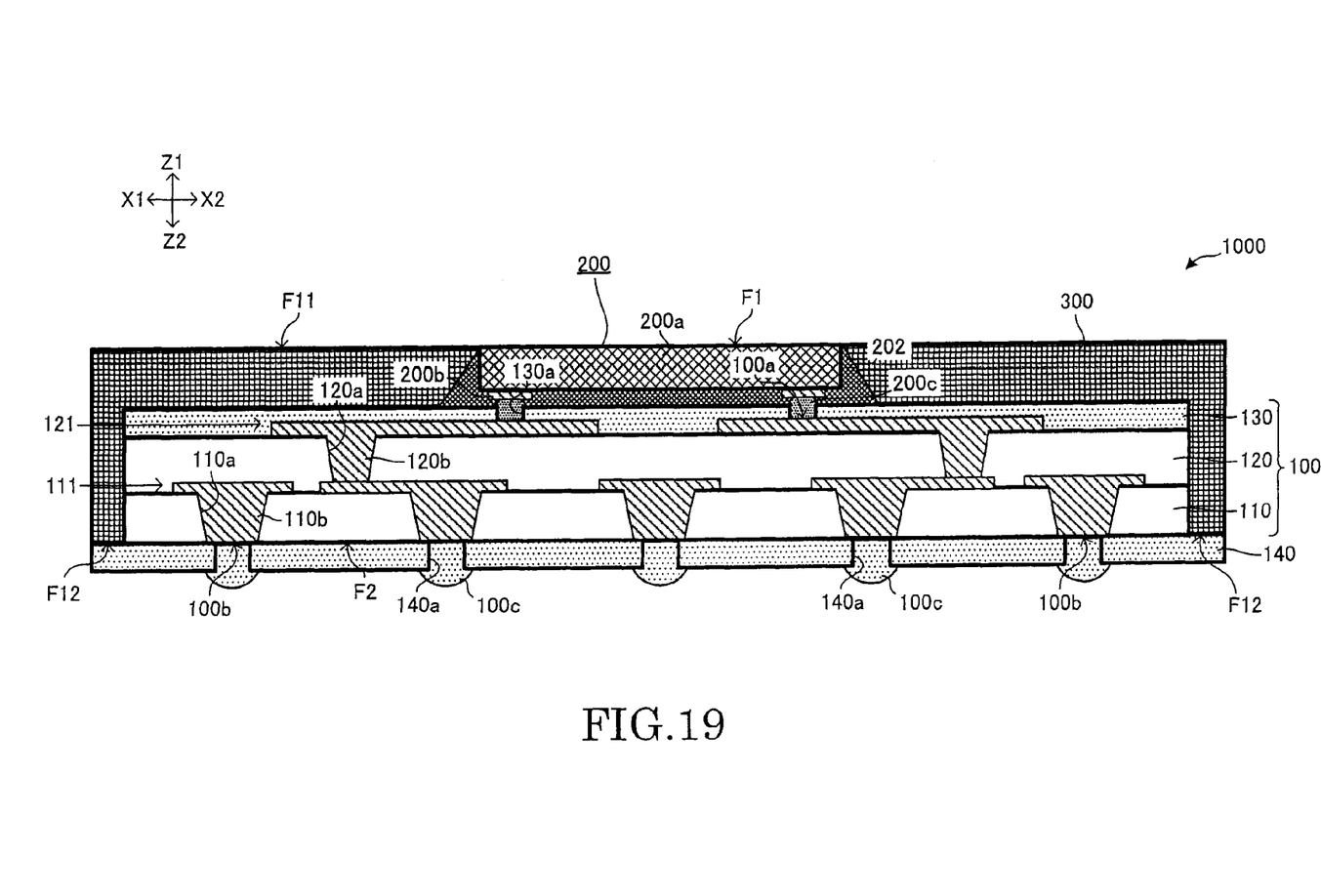
FIG. 19 is a view showing an example in which the surface of the semiconductor element mounted on a wiring board is exposed.

For example, as shown in FIG. 19, surface (F1) of semiconductor chip 200 may be exposed by polishing encapsulating resin 300. Namely, encapsulating resin 300 has surface (F11) positioned on substantially the same level as surface (F1) of semiconductor chip 200. It is preferred that a metallic frame (not shown in the drawing) be formed on semiconductor chip 200. In such a case, electronic component 1000 becomes thinner and heat dissipation from semiconductor chip 200 improves as well.

Regarding other factors, the structure of the above electronic component 1000 as well as the type, performance, dimensions, quality, shape, number of layers, positioning and so forth of the elements of such a structure, may be modified freely within a scope that does not deviate from the gist of the present invention.

For example, a buildup process may be carried out on the first main surface side or the second main surface side from the stage previously shown in FIG. 7 or FIG. 15 to make a multilayered wiring board.

The material for each conductive pattern is not limited to the above, and may be modified according to usage requirements or the like. For example, electroless copper plating may be used as the material for first conductive film that forms conductive patterns. In addition, through-hole conductors may be used instead of via conductors. The material for each insulation layer may also be selected freely. For example, as for resins to form interlayer insulation layers, thermosetting resins or thermoplastic resins may be used. As for thermosetting resins, for example, other than epoxy resin and polyimide, BT resin, allyl polyphenylene ether resin (A-PPE resin), aramid resin or the like may be used. Also, as for thermoplastic resins, for example, liquid-crystal polymer (LCP), PEEK resin, PTFE resin (fluoro resin) or the like may be used. Such materials are preferred to be selected according to requirements from the viewpoint of insulation, dielectric properties, heat resistance, mechanical features and so forth. In addition, the above resins may contain additives such as a curing agent, a stabilizer, filler or the like. Alternatively, each conductive pattern and each insulation layer may be formed with multiple layers made of different materials.

The method for manufacturing electronic components is not limited to the order and contents shown in the flowchart of FIG. 4; the order and contents may be modified freely within a scope that does not deviate from the gist of the present invention. Also, depending on usage requirements or the like, some steps may be omitted.

The above embodiment and modified examples and the like may be combined freely. It is preferred to select an appropriate combination according to usage requirements or the like. For example, the structures shown earlier in FIGS. 17~19 may be combined.

An electronic component according to the first aspect of the present invention has the following: a wiring board formed with interlayer insulation layers and conductive patterns on the interlayer insulation layers, and having a first main surface and a second main surface opposite the first main surface; first bumps formed on a first conductive pattern positioned on the first main surface side among the conductive patterns; a semiconductor element mounted on the first main surface of the wiring board through the first bumps; encapsulating resin to encapsulate the semiconductor element; and second bumps formed on a second conductive pattern positioned on the second main surface side among the conductive patterns. The encapsulating resin coats at least part of a side surface of the wiring board.

A method for manufacturing an electronic component according to the second aspect of the present invention includes the following: preparing a support material; forming a laminated section on the support material by alternately laminating an interlayer insulation layer and a conductive pattern; forming a groove to surround a predetermined region of the laminated section; in the region of the laminated section, mounting a semiconductor element through bumps on the conductive pattern positioned on the outermost layer; forming encapsulating resin in the groove and on the region of the laminated section to encapsulate the semiconductor element; removing the support material; and by cutting along the groove, cutting out the region of the laminated section and the encapsulating resin which coats at least part of at least one side surface of the region.

Obviously, numerous modifications and variations of the present invention are possible in light of the above teachings. It is therefore to be understood that within the scope of the appended claims, the invention may be practiced otherwise than as specifically described herein.

What is claimed is:

1. An electronic component, comprising:
a wiring board comprising a plurality of interlayer insulation layers and a plurality of conductive patterns;
a plurality of first bumps formed on a first conductive pattern of the conductive patterns positioned on a first surface of the wiring board;
a semiconductor element mounted on the first surface of the wiring board through the first bumps;
an encapsulating resin encapsulating the semiconductor element and the wiring board such that the encapsulating resin covers side surfaces of the interlayer insulation layers and exposes a second surface of the wiring board on an opposite side with respect to the first surface of the wiring board; and
a plurality of second bumps formed on the second surface of the wiring board and connected to a second conductive pattern of the conductive patterns in the wiring board,
wherein the semiconductor element, encapsulating resin and wiring board satisfy a relationship $C1<C2<C3$, where C1 represents a thermal expansion coefficient of the semiconductor element, C2 represents a thermal expansion coefficient of the encapsulating resin, and C3 represents a thermal expansion coefficient of the wiring board, and the encapsulating resin encapsulating the wiring board such that a portion of the encapsulating resin covering the side surfaces of the interlayer insulation layers has a thickness in a range of 0.1 μm to 0.5 μm.

2. The electronic component according to claim 1, wherein each of the interlayer insulation layers comprises photosensitive resin.

3. The electronic component according to claim 1, wherein the encapsulating resin comprises a flexible epoxy resin and a bisphenol-type epoxy resin.

4. The electronic component according to claim 1, wherein the plurality of second bumps is formed on the second surface of the wiring board such that the plurality of second bumps is positioned to mount a motherboard on the second surface of the wiring board.

5. The electronic component according to claim 1, wherein the encapsulating resin is encapsulating an entire portion of a side surface of the wiring board.

6. The electronic component according to claim 1, wherein the encapsulating resin is encapsulating the wiring board such that the encapsulating resin has a surface which is substantially on a same level as the second surface of the wiring board.

7. The electronic component according to claim 1, wherein the wiring board includes a plurality of via conductors having a tapered column shape with a diameter decreasing toward the second surface of the wiring board and penetrating through one of the interlayer insulation layers such that the second bumps are formed on bottom portions of the via conductors and connected to the second conductive pattern through the via conductors, respectively.

8. The electronic component according to claim 1, wherein the second bumps are formed at a pitch which is set greater than a pitch of the first bumps.

9. The electronic component according to claim 1, wherein the wiring board further comprises a plurality of second via conductors penetrating through one of the interlayer insulation layers such that the second via conductors are connecting the first conductive pattern and the second conductive pattern.

10. The electronic component according to claim 1, wherein the encapsulating resin is encapsulating the semiconductor element such that the encapsulating resin forms a surface substantially on a same level as a surface of the semiconductor element.

11. The electronic component according to claim 1, wherein the interlayer insulation layers and the conductive patterns are alternately laminated in the wiring board.

12. The electronic component according to claim 1, further comprising a solder resist layer formed on the second surface of the wiring board.

13. The electronic component according to claim 1, further comprising a solder resist layer formed on the second surface of the wiring board, wherein the encapsulating resin is encapsulating the wiring board such that the encapsulating resin covers entire portions of the side surfaces of the interlayer insulation layers extending between the first surface and second surface of the wiring board and extends to a surface of the solder resist facing the second surface of the wiring board.

14. The electronic component according to claim 1, further comprising a solder resist layer formed on the second surface of the wiring board, wherein the encapsulating resin is encapsulating the wiring board such that the encapsulating resin covers entire portions of the side surfaces of the interlayer insulation layers extending between the first surface and second surface of the wiring board.

15. A method for manufacturing an electronic component, comprising:
preparing a support material;
forming on the support material a laminated structure comprising a plurality of interlayer insulation layers, a plurality of conductive patterns, a plurality of bumps and a plurality of via conductors;
forming a groove in the laminated body such that a portion of the laminated body is surrounded by the groove;
mounting on the portion of the laminated body a semiconductor element through the bumps on a conductive pattern formed on a surface of the laminated body;
filling an encapsulating resin in the groove and over the portion of the laminated body such that the semiconductor element and at least a portion of the laminated body is encapsulated by the encapsulating resin;
removing the support material from the laminated body;
forming a plurality of second bumps on a surface of the laminated body exposed by the removing of the support material such that the second bumps are formed on end portions of the via conductors exposed by the removing of the support material and connected to one of the conductive patterns through the via conductors in the laminated body, respectively; and
cutting through the encapsulating resin along the groove after curing the encapsulating resin such that the portion of the laminated body is cut out and the encapsulating resin encapsulates at least a portion of a side surface of the laminated body,
wherein the semiconductor element, encapsulating resin and laminated body satisfy a relationship C1<C2<C3, where C1 represents a thermal expansion coefficient of the semiconductor element, C2 represents a thermal expansion coefficient of the encapsulating resin, and C3 represents a thermal expansion coefficient of the laminated body, and the filling of the encapsulating resin comprises encapsulating the laminated body with the encapsulating resin such that a portion of the encapsulating resin covering the portion of the side surface of the laminated body has a thickness in a range of 0.1 μm to 0.5 μm.

16. The method for manufacturing an electronic component according to claim 15, wherein each of the interlayer insulation layers is photosensitive resin.

17. The method for manufacturing an electronic component according to claim 15, wherein the encapsulating resin comprises a flexible epoxy resin and a bisphenol-type epoxy resin.

18. The method for manufacturing an electronic component according to claim 15, wherein the forming of the groove comprises forming a groove penetrating through the laminated body.

19. An electronic component, comprising:
a wiring board comprising a plurality of interlayer insulation layers and a plurality of conductive patterns;
a plurality of first bumps formed on a first conductive pattern of the conductive patterns positioned on a first surface of the wiring board;
a semiconductor element mounted on the first surface of the wiring board through the first bumps;
an encapsulating resin encapsulating the semiconductor element and the wiring board such that the encapsulating resin covers side surfaces of the interlayer insulation layers and exposes a second surface of the wiring board on an opposite side with respect to the first surface of the wiring board; and
a plurality of second bumps formed on the second surface of the wiring board and connected to a second conductive pattern of the conductive patterns in the wiring board,
wherein the semiconductor element, encapsulating resin and wiring board satisfy a relationship C1<C2<C3, where C1 represents a thermal expansion coefficient of the semiconductor element, C2 represents a thermal expansion coefficient of the encapsulating resin, and C3 represents a thermal expansion coefficient of the wiring board, and the wiring board includes a plurality of via conductors having a tapered column shape with a diameter decreasing toward the second surface of the wiring board and penetrating through one of the interlayer insulation layers such that the second bumps are formed on bottom portions of the via conductors and connected to the second conductive pattern through the via conductors, respectively.

20. The electronic component according to claim 19, wherein each of the interlayer insulation layers comprises photosensitive resin, and the encapsulating resin comprises a flexible epoxy resin and a bisphenol-type epoxy resin.

* * * * *